United States Patent [19]

Anderson et al.

[11] Patent Number: 4,901,350
[45] Date of Patent: Feb. 13, 1990

[54] CLOSED-LOOP AUDIO ATTENUATOR

[75] Inventors: Fred J. Anderson, Kokomo; Richard A. Kennedy, Russiaville; Gregory J. Manlove; Jeffrey J. Marrah, both of Kokomo, all of Ind.

[73] Assignee: Delco Electronics Corporation, Kokomo, Ind.

[21] Appl. No.: 340,834

[22] Filed: Apr. 20, 1989

[51] Int. Cl.⁴ .............................................. H04H 5/00
[52] U.S. Cl. ......................................... 381/13; 381/10
[58] Field of Search ............................. 381/10, 11, 13

[56] References Cited

U.S. PATENT DOCUMENTS 4,198,543  4/1980  Schertz et al. ....................... 381/10

Primary Examiner—Forester W. Isen
Attorney, Agent, or Firm—Albert F. Duke

[57] ABSTRACT

A closed-loop attenuator for an FM stereo receiver provides attenuation to the L+R audio signal in a controlled and predictable reaction to an ultrasonic noise (USN) voltage presented to an input amplifier. This is accomplished through a closed-loop circuit configuration including a multiplier which modulates the current output of the input amplifier in accordance with the output of a master differential amplifier and supplies the modulated current to a gain stage connected to the input of the master differential amplifier. The output of the master amplifier is mirrored by a slave differential amplifier which applies the actual audio signal attenuation. The closed-loop configuration confines this linear control action to a very narrow range. Outside of this range, the circuit provides either full attenuation or no attenuation.

3 Claims, 3 Drawing Sheets

CLOSED-LOOP AUDIO ATTENUATOR

FIELD OF THE INVENTION

This invention relates to adaptive audio processing of detected signals in an FM Stereo receiver and more particularly to a closed-loop audio attenuator which provides accurate attenuation control over the crucial narrow range of control signal where attenuation is desired.

BACKGROUND OF THE INVENTION

Reduction of noise to enhance the perceived signal-to-noise ratio is the primary function of typical audio processors applied to FM receivers. These circuits are usually applied to the detected audio signal after stereo decoding has taken place. The three most commonly applied audio processing mechanisms are blend, rolloff, and audio attenuation (or mute). Blend is the reduction in L−R content, rolloff is the reduction of high-frequency content (where noise is not easily masked by program material), and audio attenuation is the reduction of the overall audio signal level in a gradual squelch-type action.

As signal conditions degrade, these mechanisms are applied in this order to minimize the disruptive effect as perceived by the listener. Typically, blend is applied when the RF signal drops below a level of 50 to 100 uV or during slight signal disturbances, while rolloff and attenuation are best applied only as conditions degrade severely.

The application of audio processing is very dependent upon the response of the FM receiver to multipath interference and loss of signal. In particular, the noise output of the detector under weak signal conditions dictates the threshold of both rolloff and attenuation. This is due to the relative steepness of the S/N curve vs. RF input for the FM detector. As the signal level is reduced, the noise characteristic can be divided into three distinct regions as influenced by receiver noise floor, thermal noise at the antenna, and detector-generated (capture) noise. The graph shown in FIG. 1, illustrates this behavior.

Blend is typically applied as soon as the thermal noise at the antenna begins to limit the stereo S/N. It should be noted that the stereo S/N ratio is about 23 dB worse than mono at this point. Rolloff is best applied at a point below, say, 10 uV, where the detector is contributing the majority of the noise power. Finally, when the overall S/N ratio collapses and the noise floor rises to within 20 dB or so of the full-strength detected audio, an audio attenuation action is desirable to keep the overall noise volume below a point of annoyance to the listener.

Depending on the slope of the FM detector noise characteristic, the need for an audio attenuator varies. With certain receivers, the slope is much gentler and the point of convergence of the two curves (detected audio and noise) is at a lower audio level. In such receivers the need for an audio attenuator has not been great. However, hard-limiting switched-capacitor type FM detectors have much steeper noise slopes and need an audio attenuator to enhance listenability under weak or no signal conditions. As a subjective rule, the level of the noise floor (which increases as signal strength decreases) should remain at least 22 dB below full quieting 100% modulated audio. In accordance with the present invention a closed-loop audio attenuator circuit is provided that insures that these concerns are met.

SUMMARY OF THE INVENTION

Ultrasonic noise (USN) is a good indicator of signal strength at low RF levels. In accordance with the present invention an audio attenuator is disclosed which provides a controlled, predictable reaction to USN and thus variations in signal strength at low RF signal levels. The attenuator include s a master section comprising a differential amplifier which is connected in a closed-loop with a multiplier and a gain stage. The closed-loop circuit is preceded by an input amplifier which responds to the USN input through an RC time constant circuit. This time constant determines how quickly the attenuator reacts to signal disturbances, as indicated by variations in the USN voltage. The master sections response to the signal from the gain stage is mirrored by a slave section which applies the actual audio signal attenuation. The closed-loop configuration confines this linear control action to a very narrow range. Outside of this range, the circuit provides either full attenuation (15-20 dB nominal) or no attenuation (0 dB). The closed-loop configuration is desirable because the crucial voltage range at the output of the USN detector, where a large amount of attenuation action is needed, is very small compared to the entire range of USN voltage.

BRIEF DESCRIPTION OF THE DRAWINGS

The above and other advantages of the invention will become more apparent from the following description taken in conjunction with the accompanying drawings wherein like references refer to like parts and wherein.

DESCRIPTION OF THE PREFERRED EMBODIMENT

Figure 1:
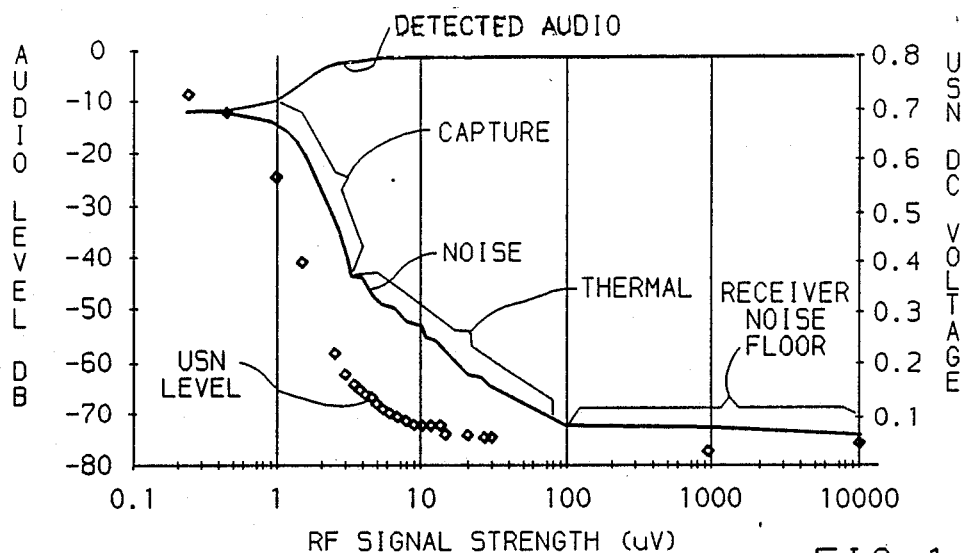
FIG. 1 is a graph illustrating noise characteristics as a function of signal strength.

Referring now to the drawings, FIG. 1 illustrates the correlation of in-band audible noise to Ultrasonic noise (USN) i.e. noise in the ultrasonic frequency range of the detected composite signal (from 100–200 kHz). Among several possible audio processing flags (AGC level, AM disturbances on AGC, AM level, 19 kHz pilot noise etc.) the USN level gives the most reliable representation of in-band noise with the maximum dynamic range. The USN voltage may be generated by band pass filtering the high-frequency (100 kHz–200 kHz) noise band in the detected composite signal, and thereafter rectifying and low pass filtering to approximately 1 kHz. The resulting DC control voltage (referenced to an arbitrary reference voltage representing quiet conditions) is an accurate representation of the noise level.

Figure 2:
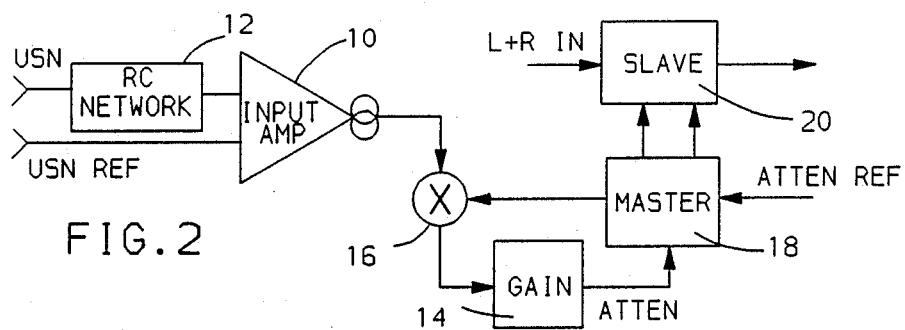
FIG. 2 is a block diagram of the closed-loop attenuator of the present invention.
Figure 3:
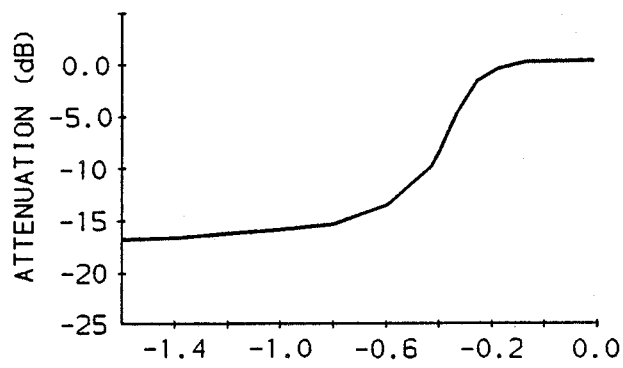
FIG. 3 is a graph showing the range over which linear control of attenuation is applied.
Figure 4:
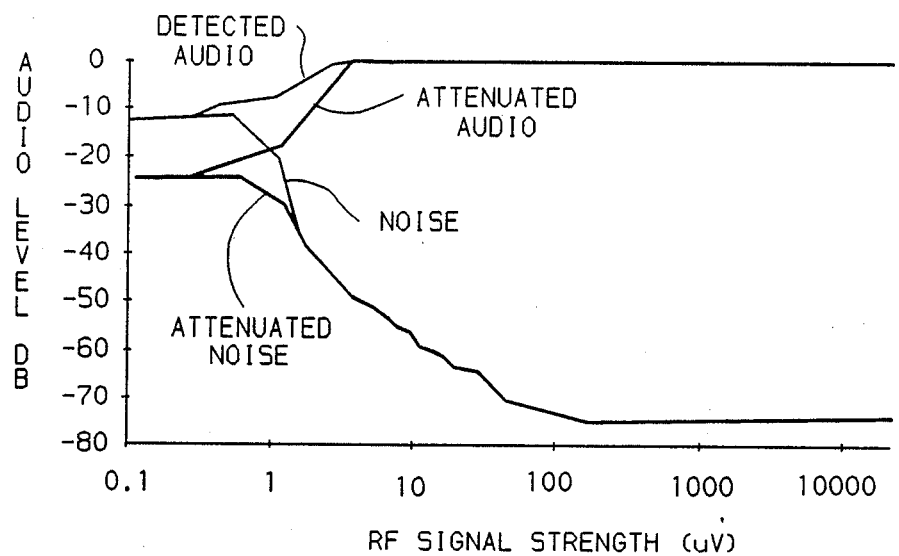
FIG. 4 is a graph illustrating the effect of the closed-loop attenuator of the present invention on the S/N curve.

The function of the closed-loop attenuator of the present invention is to provide controlled, predictable reaction to the USN voltage. As shown in FIG. 2, the USN voltage is applied to one input of an input amplifier 10 through an RC time constant circuit 12. This time constant determines how quickly the attenuator will react to variations in the USN voltage. The other input of the amplifier 10 is connected to a USN reference voltage which determines the trip point of the amplifier 10. The controlled, predictable reaction to the USN voltage is accomplished through the use of a gain stage 14 in a closed-loop which includes a multiplier 16 responsive to the output of the amplifier 10 and to the output of a master differential amplifier 18 which responds to the output of the gain stage 14. The output of the master amplifier is mirrored by a slave differential amplifier 20 which applies the actual audio signal attenuation. The closed-loop configuration confines this linear control action to a very narrow range as shown in FIG. 3. Outside of this range, the circuit provides either full attenuation (15–20 dB nominal) or no attenuation (0 ds). The attenuator's effect on the S/N curve is shown in FIG. 4.

Figure 5:
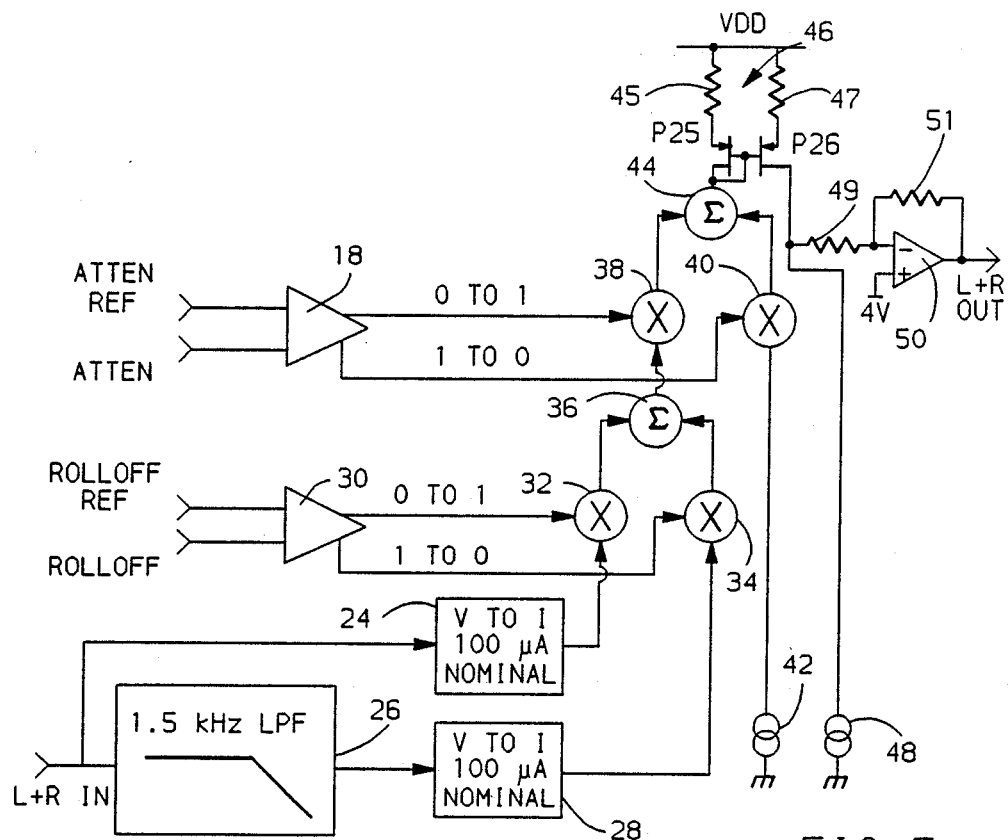
FIG. 5 is a block diagram of the L+R steering section.

A block diagram of the L+R signal steering section of the receiver is shown in FIG. 5. The L+R input signal is fed directly to a voltage to current converter 24 and through a lowpass filter 26 to a voltage to current converter 28 to produce direct and lowpass-filtered varying current versions of the L+R signal. The direct and low-passed signals are applied to multipliers 32 and 34 which are controlled from differential amplifier 30 in proportion to the voltage level of ROLLOFF with respect to ROLLOFF REF. If Rolloff is very high, the direct signal will be multiplied by 1 and the low-passed signal will be multiplied by 0, thus resulting in only a direct signal when the signals are added together at the summer 36. If Rolloff is very low with respect to Rolloff Ref, then the direct signal will be multiplied by 0 and the low-passed signal will be multiplied by 1, thus resulting in only a rolled-off signal when the signals are added together. Similarly, when the amplifier 30 is only partially tilted at a given Rolloff level, a partially rolled-off signal will result due to the proportional mixing of direct and low-passed signal.

Similarly, the closed-loop audio attenuator includes multipliers 38 and 40 which steer signal currents arriving from the rolloff multipliers and from a 100 uA quiet current arriving from a current source 42 in accordance with the relationship between the ATTEN REF and ATTEN voltages applied to master amplifier 18. This results in a proportional mix of signal and quiet currents at the output of summer 44. The output of the summer 44 is applied to the current mirror 46 comprising transistors P25, P26 and resistors 45, 47. The difference between the output of current mirror 46 and current source 48 is applied to an output stage comprising amplifier 50 and resistors 49 and 51.

Figure 6:
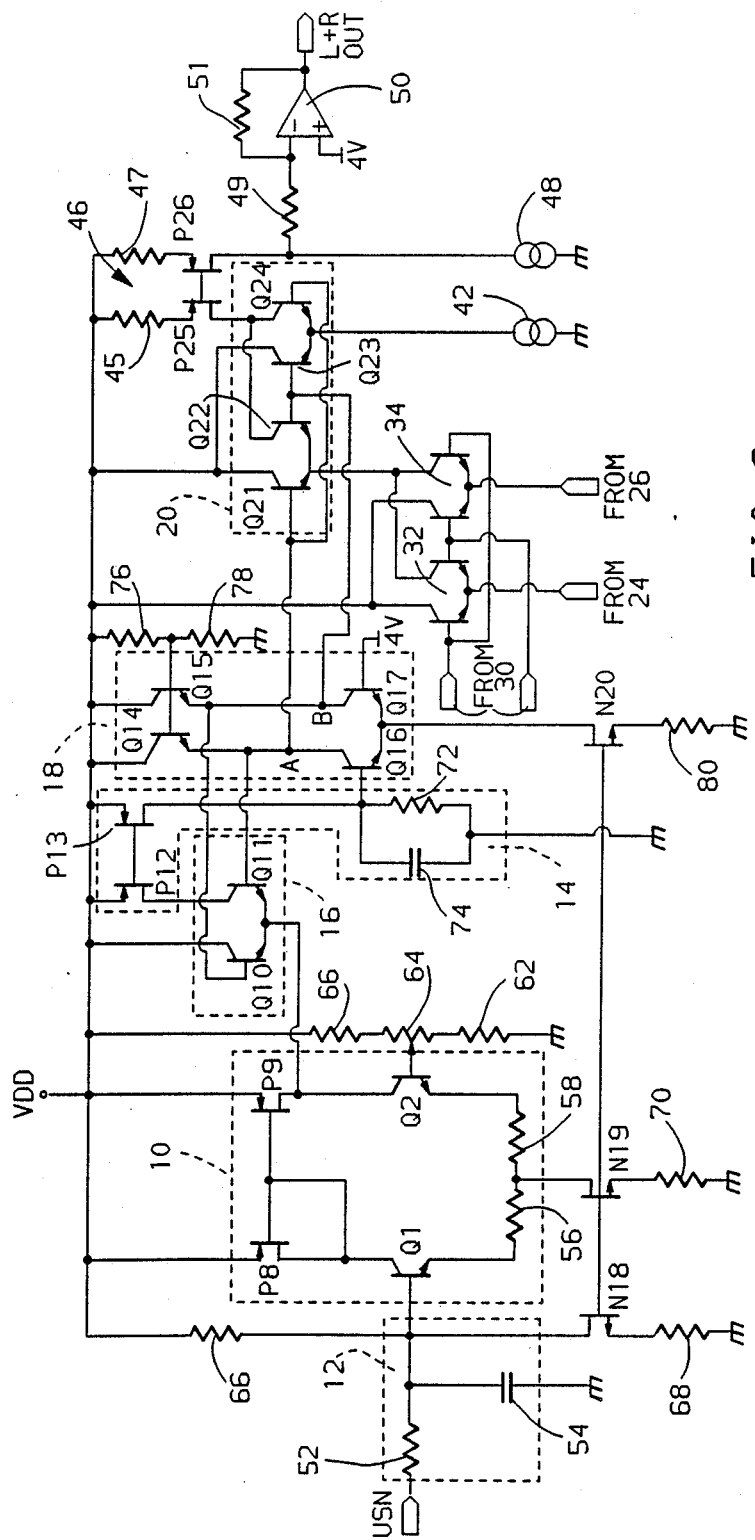
FIG. 6 is a detailed schematic diagram of the invention.

Referring now to FIG. 6, the time constant section 12 comprises resistor 52 and capacitor 54 and applies filtering to the USN voltage to avoid excessive chewing or modulation of the audio signal as a result of rapid noise fluctuations. The input amplifier comprises bipolar transistors Q1, Q2, P channel MOS transistors P8, P9, and resistors 56, 58. Q1 & Q2 form a differential input pair, with a trip point, USN REF, established by fixed resistors 60, 62 and variable resistor 64 connected to the base of transistor Q2. P8 and P9 form a current mirror to link the input amplifier 10 with the multiplier 16. The input amplifier Q1, Q2, P8 and P9 provide a differential current to the multiplier 16. The differential current is a function of the difference in voltage between USN and USN REF and the current flowing through the input amplifier as established by the resistor 66 and current source comprising N channel MOS devices N18, N19 and resistors 68, 70.

The multiplier 16 comprises transistors Q10 and Q11 which modulate the current from the input amplifier 10 in accordance with the voltage output of the master differential amplifier 18. P12 and P13 reflect the current through the transistor Q11 of multiplier 16 to a resistor 72 which converts the current to a voltage. The capacitor 74 across the resistor 72 is for stabilization. Master amplifier 18 comprises transistors Q14–Q17 and resistors 76, 78 connected with current source comprising transistor N20 and resistor 80. The amplifier 18 amplifies the voltage at the base of Q16 and feeds back a differential control voltage from nodes A and B to the multiplier 16.

As the USN voltage falls below the trip point, current begins to flow through the multiplier 16. This current is steered through Q10 and Q11 of the multiplier 16 as a function of the node voltages A and B which provides the closed-loop feedback. The output current of the multiplier 16 is reflected across the resistor 72 to generate the voltage ATTEN which is applied to the input of the master amplifier 18. As USN decreases in voltage, ATTEN increases, causing the voltage on node A to decrease and the voltage on node B to increase. This, in turn, causes the multiplier 16 to begin attenuating the percentage of multiplier current flowing across resistor 72.

The differential voltage at nodes A and B is also applied to the slave circuitry Q21–Q24 which applies the variable attenuation to the L+R signal current. As the voltage on node A decreases, the output current of the slave amplifier 20 contains less AC information and the same DC information to produce an attenuation of the signal. Due to the high gain stage and feedback, a linear relationship is established between the USN voltage and the audio gain when USN is less than USN REF. The ultimate gain is set by the current through the input amplifier 10 and the resistor 72 in the gain stage.

The closed-loop audio attenuator of the present invention provides an overall volume reduction in order to make severe noise conditions more tolerable. Due to the closed-loop nature of the circuit, precise and predictable attenuation levels can be designed against expected USN noise curves. The three important parameters of the circuit are gain (overall volume reduction), trip point (USN level where attenuation action starts), and time constant (response time to USN disturbances). The gain is determined by open-loop gain; in particular, it is most easily varied by adjusting the gain of the input amplifier 10 (FIG. 2). The trip point is determined by the reference voltage at the input amplifier 10, and the time constant is determined by the value of the RC network of the timer section 12.

The embodiments of the invention in which an exclusive property or privilege is claimed are defined as follows:

1. An audio attenuator circuit for an FM stereo receiver providing substantially linear audio attenuation over a predefined range of RF signal strength, comprising a slave section for combining proportional amounts of L+R signal and quiet signal in accordance with a differential control signal to thereby produce an attenuated audio signal, control means comprising a master differential amplifier responsive to a reference voltage and to an input voltage from a gain stage and providing said differential control signal as an output, an input amplifier responsive to an ultrasonic noise input of predetermined duration and magnitude, current multiplier means for modulating a current output of said input amplifier in accordance with a differential output of said master differential amplifier and for applying the modulated current output to said gain stage.

2. A closed-loop audio attenuator providing a controlled, predictable reaction to an ultrasonic noise (USN) voltage, comprising an input amplifier responsive to the differential between said USN voltage and to a reference voltage, a closed-loop circuit comprising a current multiplier, a master differential amplifier and a gain stage connected to the input of said master differential amplifier, said current multiplier modulating a current from the input amplifier in response to an output of said master differential amplifier and supplying the modulated current to said gain stage, slave differential amplifier means for combining proportional amounts of L+R signal current and quiet current in accordance with the output of the master differential amplifier to produce an attenuated audio output signal as a function of said USN voltage.

3. An audio attenuator circuit for attenuating an audio signal in response to variations in an ultrasonic noise input signal, comprising ultrasonic noise detector means including an input differential amplifier responsive at one input to an ultrasonic noise reference voltage, time delay means applying said ultrasonic noise input to a second input of said input differential amplifier for establishing a predetermined response time to variations in the noise input signal, said input amplifier providing an output current proportional to the amount the noise input signal exceeds the noise reference voltage, a master differential amplifier responsive to an attenuation reference input, a gain stage providing an attenuation input voltage to said master differential amplifier, said master differential amplifier providing a differential output voltage as a function of the difference between said attenuation reference input and said attenuation input voltage, a current multiplier for modulating the current from said input differential amplifier by the voltage output of said master differential amplifier and supplying the modulated current to said gain stage, slave differential amplifier means for developing an audio output signal by combining proportional amounts of L+R signal current and quiet current as a function of the differential voltage output of said master amplifier.

* * * * *